(12) United States Patent
Nishinohara et al.

(10) Patent No.: US 9,549,473 B2
(45) Date of Patent: Jan. 17, 2017

(54) PRINTED WIRING BOARD, PRINTED WIRING BOARD MANUFACTURING METHOD, AND ELECTRONIC DEVICE

(71) Applicants: TOYO INK SC HOLDINGS CO., LTD., Tokyo (JP); TOYOCHEM CO., LTD., Tokyo (JP)

(72) Inventors: Satoshi Nishinohara, Tokyo (JP); Hidenobu Kobayashi, Tokyo (JP); Kazunori Matsudo, Tokyo (JP); Tsutomu Hayasaka, Tokyo (JP)

(73) Assignees: TOYO INK SC HOLDINGS CO., LTD., Tokyo (JP); TOYOCHEM CO., LTD., Tokyo (JP)

( * ) Notice: Subject to any disclaimer, the term of this patent is extended or adjusted under 35 U.S.C. 154(b) by 0 days.

(21) Appl. No.: 15/033,211

(22) PCT Filed: Aug. 27, 2015

(86) PCT No.: PCT/JP2015/004314
§ 371 (c)(1),
(2) Date: Apr. 29, 2016

(87) PCT Pub. No.: WO2016/035292
PCT Pub. Date: Mar. 10, 2016

(65) Prior Publication Data
US 2016/0270243 A1    Sep. 15, 2016

(30) Foreign Application Priority Data

Sep. 4, 2014    (JP) ................................. 2014-179829

(51) Int. Cl.
*H05K 1/09*    (2006.01)
*H05K 1/03*    (2006.01)
(Continued)

(52) U.S. Cl.
CPC ............... *H05K 3/4611* (2013.01); *H05K 1/02* (2013.01); *H05K 2201/0302* (2013.01); *H05K 2201/0364* (2013.01)

(58) Field of Classification Search
CPC    H05K 3/4611; H05K 1/02; H05K 2201/0364; H05K 2201/0302
(Continued)

(56) References Cited

U.S. PATENT DOCUMENTS 6,280,828 B1 *  8/2001  Nakatsuka .......... H01L 23/4985
                                                          174/254
8,282,412 B1 * 10/2012  Yaguchi ............. H01R 13/5804
                                                          439/492
(Continued)

FOREIGN PATENT DOCUMENTS

CN    102933024    2/2013
CN    103283313    9/2013
(Continued)

OTHER PUBLICATIONS

First Notification of Examination Opinion issued on Aug. 31, 2016 in Chinese Patent Application No. 201580002392.8.

*Primary Examiner* — Sherman Ng
(74) *Attorney, Agent, or Firm* — Seyfarth Shaw LLP

(57) ABSTRACT

An object of the invention is to provide a printed wiring board which is less likely to cause foaming even after a reflow step and in which a metal reinforcing plate is less likely to be peeled off, a manufacturing method thereof, and an electronic device. A printed wiring board (1) according to the present invention includes a wiring circuit board (6), a conductive adhesive layer (3), and a metal reinforcing plate (2). The conductive adhesive layer (3) is bonded to each of the wiring circuit board (6) and the metal reinforcing plate (2). The metal reinforcing plate (2) includes a nickel layer (2*b*) formed on a surface of a metal plate (2*a*). A ratio of a (Continued)

surface area of nickel hydroxide to nickel present in a surface of the nickel layer (2b) is more than 3 and equal to or less than 20.

6 Claims, 1 Drawing Sheet

(51) Int. Cl.
    *H01R 43/00*     (2006.01)
    *H05K 3/46*     (2006.01)
    *H05K 1/02*     (2006.01)

(58) Field of Classification Search
    USPC .......................... 174/255, 256, 257; 29/825
    See application file for complete search history.

(56) References Cited

U.S. PATENT DOCUMENTS

2009/0218117 A1*   9/2009   Sakai ................... H05K 3/0061
                                                                                                           174/254
2010/0261033 A1*   10/2010   Moriyama .............. C23C 28/00
                                                                                                          428/607

FOREIGN PATENT DOCUMENTS

JP           2005-317946       11/2005
JP           2013-041869        2/2013

\* cited by examiner

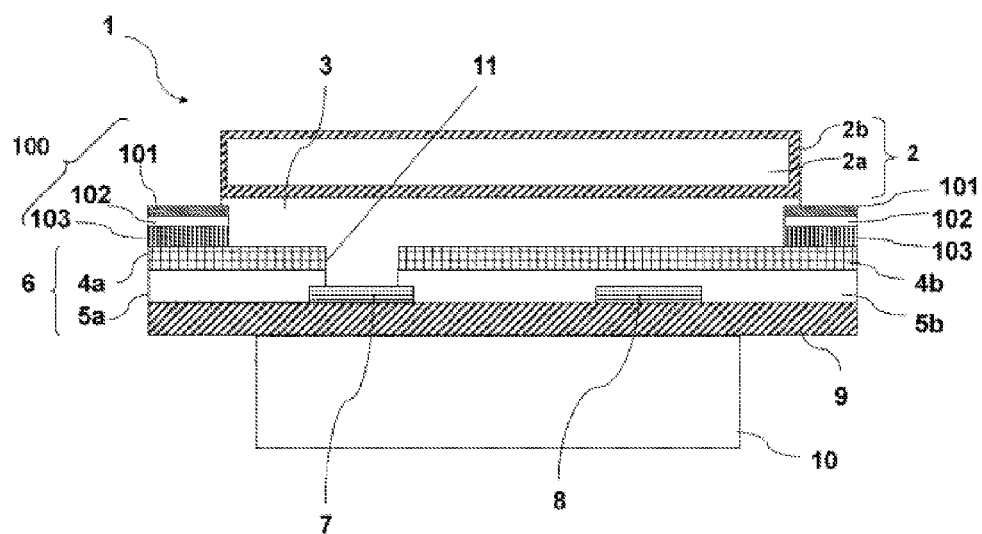

PRINTED WIRING BOARD, PRINTED WIRING BOARD MANUFACTURING METHOD, AND ELECTRONIC DEVICE

CROSS REFERENCE TO RELATED APPLICATIONS

This application is a U.S. National Stage of PCT International Patent Application Number PCT/JP2015/004314, which was filed on Aug. 27, 2015, which claims priority to Japanese Patent Application No. 2014-179829, which was filed on Sep. 4, 2014, the disclosure of each of which is incorporated herein by reference in its entirety.

TECHNICAL FIELD

The present invention relates to a printed wiring board including a reinforcing plate, a manufacturing method thereof, and an electronic device manufactured using the printed wiring board or the manufacturing method thereof.

BACKGROUND ART

Electronic devices, such as mobile phones and smartphones, are generally provided with an electromagnetic shielding layer to prevent a malfunction due to electromagnetic noise that is emitted from electronic components mounted in the electronic devices. It is necessary for printed wiring boards mounted in the electronic devices, in particular, flexible printed wiring boards having flexibility, to ensure durability for mounting the components on the surface of each printed wiring board. Accordingly, the printed wiring board is generally provided with a metal reinforcing plate. Patent Literature 1 discloses a printed wiring board having a configuration in which the printed wiring board is electrically connected with a conductive reinforcing plate through a conductive adhesive layer, to thereby enhance the shielding effect.

Also, a technique is known in which a surface of a metal reinforcing plate is nickel plated to effectively eliminate electromagnetic waves emitted by electronic components, to thereby improve the conductivity. However, there is a problem that it is difficult to bond the metal reinforcing plate to the conductive adhesive layer.

In this regard, Patent Literature 2 discloses a printed wiring board having a configuration in which a ratio of a surface area of nickel hydroxide ($Ni(OH)_2$) to nickel (Ni) on a surface of a nickel plating layer formed on a metal reinforcing plate is in a range from 1.8 to 3.0.

CITATION LIST

Patent Literature

[Patent Literature 1] Japanese Unexamined Patent Application Publication No. 2005-317946
[Patent Literature 2] Japanese Unexamined Patent Application Publication No. 2013-41869

SUMMARY OF INVENTION

Technical Problem

Although the normal adhesion force is improved in the printed wiring board disclosed in Patent Literature 2, the printed wiring board has the following problem. That is, the adhesion force is lowered in a reflow step (for example, at 230 to 270° C.), so that foaming occurs at an interface between the conductive adhesive layer and the nickel plating layer and the metal reinforcing plate is liable to be peeled off. The occurrence of foaming and peeling makes it difficult to ensure the conductivity to electrically connect a ground circuit with the metal reinforcing plate, so that the quality of the printed wiring board cannot be ensured.

The present invention has been made in view of the above-mentioned problems, and an object of the present invention is to provide a printed wiring board which is less likely to cause air bubbles even after a reflow step, has an excellent adhesion force with respect to a metal reinforcing plate, and has an excellent conductivity, a manufacturing method thereof, and an electronic device.

Solution to Problem

A printed wiring board according to the present invention includes a wiring circuit board, a conductive adhesive layer having a hydroxyl group, and a metal reinforcing plate. The conductive adhesive layer is bonded to each of the wiring circuit board and the metal reinforcing plate. The metal reinforcing plate includes a nickel layer formed on a surface of a metal plate. A ratio of a surface area of nickel hydroxide to nickel present in a surface of the nickel layer is more than 3 and equal to or less than 20. That is, 3<(the ratio of the surface area of nickel hydroxide)/(the ratio of the surface area of nickel)≤20.

A method of manufacturing a printed wiring board according to the present invention includes a step of pressure-bonding a wiring circuit board, a conductive adhesive layer, and a metal reinforcing plate so that the conductive adhesive layer is bonded to each of the wiring circuit board and the metal reinforcing plate. The metal reinforcing plate includes a nickel layer formed on a surface of a metal plate. A ratio of a surface area of nickel hydroxide to nickel present in a surface of the nickel layer is more than 3 and equal to or less than 20.

An electronic device according to the present invention includes the printed wiring board described above, or a printed wiring board manufactured by the method described above.

Advantageous Effects of Invention

The present invention according to the above aspects has advantageous effects that it is possible to provide a printed wiring board which is less likely to cause air bubbles even after a reflow step, has an excellent adhesion force with respect to a metal reinforcing plate, and has an excellent conductivity, a manufacturing method thereof, and an electronic device.

BRIEF DESCRIPTION OF DRAWINGS

FIG. 1 is a sectional view showing a configuration of a printed wiring board according to the present invention.

DESCRIPTION OF EMBODIMENTS

A printed wiring board according to the present invention will be described in detail below based on preferred embodiments shown in the accompanying drawings. Herein, the phrase "from an arbitrary number A to an arbitrary number B" refers to a range equal to or greater than the number A and a range equal to or smaller than the number B.

FIG. 1 is a sectional view showing the configuration of the printed wiring board according to the present invention. For convenience of explanation, the upper side of FIG. 1 is referred to as "top" and the lower side thereof is referred to as "bottom".

As shown in FIG. 1, a printed wiring board 1 according to the present invention includes a wiring circuit board 6; a metal reinforcing plate 2 including a nickel layer 2b formed on a surface of a metal plate 2a; and a conductive adhesive layer 3 that joins the wiring circuit board and the metal reinforcing plate. In other words, the wiring circuit board 6 and the metal reinforcing plate 2 are joined at least partially through the conductive adhesive layer 3.

Assume that in the nickel layer 2b of the metal reinforcing plate 2, a ratio of a surface area of nickel hydroxide $(Ni(OH)_2)$ to a ratio of a surface area of nickel (Ni) present in the surface of the nickel layer 2b is more than 3 and equal to or less than 20. A contact angle between water and the surface of the nickel layer 2b is preferably in a range from 50 to 100°. A surface roughness Ra of the nickel layer 2b is preferably equal to or less than 1 μm.

The ratio of the surface area of nickel hydroxide to nickel in the nickel layer 2b is a value obtained by analyzing the surface of the metal reinforcing plate 2 by X-ray Photoelectron Spectroscopy, calculating ratios of surface areas of detected nickel (Ni), nickel oxide (NiO), and nickel hydroxide $(Ni(OH)_2)$, and dividing the ratio of the surface area of the nickel hydroxide by the ratio of the surface area of the nickel. In the X-ray Photoelectron Spectroscopy (hereinafter referred to as "XPS"), a well-known measuring machine such as AXIS-HS (manufactured by Shimadzu Corporation/Kratos Corporation) can be used.

The contact angle between water and the surface of the nickel layer is a value obtained by measuring θ/2 after a lapse of 60 seconds from the time when ion exchange water is dropped on the surface of the metal reinforcing plate by a sessile drop method. The contact angle can be measured using a well-known measuring machine, such as an automatic contact angle meter DM-501 (manufactured by Kyowa Interface Science Co., LTD.), after washing the surface of the nickel layer with ethanol.

The surface roughness Ra is a value obtained by measuring the surface of the metal reinforcing plate in accordance with JIS B0601-2001 by using a laser microscope. The surface roughness can be measured using a well-known measuring machine such as a shape measurement laser microscope VK-X100 (manufactured by KEYENCE CORPORATION). The values specified in the present invention indicate values obtained by methods described in examples.

The wiring circuit board 6 has a configuration in which a ground wiring circuit 7 and a wiring circuit 8 are formed on an insulating base 9 and adhesive layers 5a and 5b and insulating layers 4a and 4b are stacked in this order so as to cover these circuits. On the other principal surface (the lower principal surface shown in FIG. 1) of the insulating base 9, an electronic component 10 is mounted at a position opposed to the metal reinforcing plate 2. When the metal reinforcing plate 2 and the electronic component 10 are located so as to be opposed to each other, a strength necessary for the printed wiring board 1 can be obtained. For example, when a bending force or the like is applied to the printed wiring board 1, the joining at a solder bonding region can be maintained, so that damage to the electronic component 10 can be prevented. The mode in which the metal reinforcing plate 2 and the electronic component 10 are located so as to be opposed to each other is not essential, and instead various modes can be used.

A cylindrical or tapered land 11 which penetrates from the surface layer of the wiring circuit board 6 to the upper surface of the ground wiring circuit 7 is provided and the land 11 is filled with the conductive adhesive layer 3 to thereby provide a conduction state. In other words, the ground wiring circuit 7 and the metal reinforcing plate 2 are electrically connected through the conductive adhesive layer 3. The conductive adhesive layer 3 functions to shield against electromagnetic waves and also functions to join the metal reinforcing plate 2 and the wiring circuit board 6 to each other.

The metal plate 2a of the metal reinforcing plate 2 is not limited thereto without departing from the scope of the present invention. Preferable examples of the metal plate 2a include conductive metals such as gold, silver, copper, iron, and stainless steel. Of these metals, stainless steel is particularly preferable in terms of the strength, cost, and chemical stability of the metal reinforcing plate. The metal reinforcing plate can be designed to have any thickness. In general, the thickness of the metal reinforcing plate is about 0.04 to 1 mm.

In the metal reinforcing plate 2, the nickel layer 2b is formed on the entire surface of the metal plate 2a. The method for forming the nickel layer 2b is not limited. However, the nickel layer 2b is preferably formed by electrolytic nickel plating. For example, when a nickel plating bath having a pH of 6.5 or more is used, an appropriate amount of nickel hydroxide can be easily generated in the nickel layer. Specifically, as the plating bath used to form the nickel layer, a nickel sulfamate bath or a Watts bath is preferably used, and a nickel sulfamate bath is more preferably used. The nickel sulfamate bath preferably includes about 200 to 600 g/L of nickel sulfamate tetrahydrate. The Watts bath preferably includes about 120 to 480 g/L of nickel sulfate hexahydrate. The nickel layer 2b can also be formed by electroless plating. The thickness of the nickel layer 2b is about 0.5 to 5 μm, and is more preferably 1 to 4 μm. Further, a well-known brightener may be mixed in the plating bath in order to adjust the smoothness of the surface of the nickel layer 2b. The nickel layer 2b of the metal reinforcing plate 2 is not necessarily formed on the entire surface of the surface layer. For example, when the metal reinforcing plate 2 including a nickel layer formed on a coil-like metal plate is used, or when a large metal reinforcing plate is cut into a desired size to be used, the metal reinforcing plate including the nickel layer 2b may be used only for the upper surface and the lower surface of the metal plate 2a.

As described above, the ratio of the surface area of nickel hydroxide to nickel present in the surface of the nickel layer 2b is more than 3 and equal to or less than 20. When the ratio of the surface area of nickel hydroxide to nickel falls within the above-mentioned range, adhesive properties can be improved by the action of an intermolecular force and a hydrogen bond between the hydroxyl group of nickel hydroxide and the hydroxyl group of the conductive adhesive layer 3. As a result, the occurrence of foaming at the interface between the metal reinforcing plate 2 and the conductive adhesive layer 3 during a reflow step, or deterioration in peel strength can be remarkably suppressed. On the other hand, when the ratio of the surface area of nickel hydroxide to nickel is equal to or less than 3, moderate adhesive properties can be obtained if there is no reflow step, while foaming and/or deterioration in peel strength may be caused at a reflow temperature. Note that the ratio of the surface area of nickel hydroxide to nickel is preferably more than 3 and equal to or less than 16.

The contact angle between water and the nickel layer 2b is preferably in a range from 50 to 100°. When the contact angle with water falls within the above-mentioned range, the affinity between the conductive adhesive layer 3 and the surface of the nickel layer 2 increases in the process of pressure-bonding the metal reinforcing plate 2 and the conductive adhesive layer 3, in particular, during thermal compression bonding. Accordingly, the wettability of the conductive adhesive layer 3 with respect to the surface of the nickel layer 2b is improved. In other words, the conductive adhesive layer 3 can easily fit the surface of the nickel layer 2b, which leads to an improvement in adhesive properties. As a result, the peel strength increases, so that a malfunction is less likely to occur during the reflow step. Note that the contact angle with water is more preferably 60 to 80°.

The nickel layer 2b preferably has the surface roughness Ra of 1 μm or less. If the value of the surface roughness Ra is small, the smoothness of the surface of the nickel layer 2b increases. Accordingly, in the case of pressure-bonding the metal reinforcing plate 2 and the conductive adhesive layer 3, in particular, during thermal compression bonding, the bond interface between the nickel layer 2b and the conductive adhesive layer 3 is less likely to be contaminated by air bubbles, so that foaming due to the air bubbles can be suppressed in the reflow step. The lower limit of the surface roughness Ra is 0 μm, but it is technically difficult to attain this. Accordingly, the surface roughness Ra is more preferably 0.01 μm.

As the metal reinforcing plate 2 including the nickel layer 2b described above, a metal plate obtained after the formation of a nickel layer may be sampled and the metal reinforcing plate 2 including the nickel layer that satisfies the above-mentioned value ranges may be appropriately selected and used.

The conductive adhesive layer 3 contains a resin and a conductive component, and is formed using an isotropic conductive adhesive or an anisotropic conductive adhesive. The term "isotropic conductive" described herein refers to the characteristic that the conductive properties are independent of directions. The term "anisotropic conductive" described herein refers to the characteristic of having conductivity in a specific direction. The conductive direction of the anisotropic conductive adhesive can be appropriately designed. However, an anisotropic conductive adhesive exhibiting conductive properties only in the vertical direction shown in FIG. 1 is preferably used. These conductive properties can be appropriately selected depending on the mode in which the printed wiring board is used.

The resin contained in the conductive adhesive layer 3 is preferably a resin having at least one of a hydroxyl group and a carboxyl group. Specific examples of the resin include acrylic resin, epoxy resin, polyester resin, polyurethane resin, urethane urea resin, silicone resin, amide resin, imide resin, amide-imide resin, elastomer resin, and gum resin. A thermosetting resin obtained by mixing a resin with a curing agent is more preferably used. Examples of the curing agent used for the thermosetting resin include an epoxy curing agent, an isocyanate curing agent, and an aziridine curing agent. Of these curing agents, the epoxy curing agent which has a high heat resistance and is capable of hardening is preferably used.

One or more types of resins can be used. When two or more types of resin are used in combination, for example, a combination of an amide resin and an elastomer resin is preferable. One or two or more types of curing agents can be used.

The conductive component contained in the conductive adhesive layer 3 is not particularly limited as long as the conductive component has conductivity. Conductive particles, conductive fiber, carbon nanotube, and the like can be appropriately selected and used. Examples of the conductive particles include metals, such as gold, silver, copper, iron, nickel, and aluminum, an alloy thereof, and an inorganic material such as carbon black, fullerene, and graphite. A silver-coated copper particles obtained by coating the surface of copper particles with silver can also be used.

Further, a tackifier resin, an ion scavenger, an inorganic filler, a metal deactivator, a fire retardant, a photo-polymerization initiator, an antistatic additive, an antioxidant, and the like can be appropriately selected and included in the conductive adhesive layer 3 within a range that does not impair the object of the present invention. The thickness of the conductive adhesive layer 3 is generally about 30 to 80 μm.

The insulating layers 4a and 4b are also called cover lay films which contain at least a resin. Examples of the resin include acrylic resin, epoxy resin, polyester resin, polyurethane resin, urethane-urea resin, silicone resin, polyamide resin, polyimide resin, amide-imide resin, and phenol resin. Further, thermoplastic resin, thermosetting resin, and ultraviolet curing resin can be appropriately selected and used as the resin. The thermosetting resin is preferable in terms of heat resistance. One or two or more types of these resins can be used. The thickness of each of the insulating layers 4a and 4b is generally about 5 to 50 μm.

The adhesive layers 5a and 5b are formed of, for example, thermosetting resin, such as acrylic resin, epoxy resin, polyester resin, urethane resin, silicone resin, and amide resin, or thermoplastic resin. Examples of the curing agent used for the thermosetting resin include an epoxy curing agent, an isocyanate curing agent, and an aziridine curing agent. The adhesive layers 5a and 5b have insulating properties and are used to bond the insulating layers 4a and 4b with the insulating base 9 including the ground wiring circuit 7 and the wiring circuit 8. The thickness of each of the adhesive layers 5a and 5b is generally about 1 to 20 μm.

The ground wiring circuit 7 and the wiring circuit 8 are generally formed by etching a conductive metal layer, such as copper, or by printing a conductive paste. Although not shown, the wiring circuit board 6 can include a plurality of ground wiring circuits 7 and a plurality of wiring circuits 8. The ground wiring circuit 7 is a circuit that maintains a ground potential. The wiring circuit 8 is a circuit or the like that transmits electric signals to electronic components and the like. The thickness of each of the ground wiring circuit 7 and the wiring circuit 8 is generally about 5 to 50 μm.

The insulating base 9 is a film having insulating properties, such as polyimide, polyamide imide, polyphenylene sulfide, polyethylene terephthalate, and polyethylene naphthalate. The insulating base 9 is a base material for the wiring circuit board 6. When the reflow step is carried out, the insulating base 9 is preferably formed of polyphenylene sulfide and polyimide. When the reflow step is not carried out, the insulating base 9 is preferably formed of polyethylene terephthalate. The thickness of the insulating base 9 is generally about 5 to 100 μm.

The land 11 is formed by etching, laser, or the like so that a part of the circuit pattern which is appropriately selected from the ground wiring circuit 7 and the wiring circuit 8 is exposed. Referring to FIG. 1, a part of the ground wiring circuit 7 is exposed by the land 11, and the ground wiring circuit 7 and the metal reinforcing plate 2 are electrically connected through the conductive adhesive layer 3. The diameter of the land 11 is generally about 0.5 to 2 mm.

The printed wiring board 1 generally includes an electromagnetic shielding sheet 100. The electromagnetic shielding sheet 100 generally includes an insulating layer 101, a metal film 102, and a conductive adhesive layer 103. When the electric signal passing through the wiring circuit 8 has a high frequency, it is particularly preferable to provide the electromagnetic shielding sheet 100. Although not shown, when the electric signal passing through the wiring circuit 8 has a relatively low frequency, the electromagnetic shielding sheet may include at least the insulating layer 101 and the conductive adhesive layer 103.

While the insulating layer 101 can be formed using a film having insulating properties, such as the insulating base 9 described above, the insulating layer 101 can also be formed of a thermosetting resin which is appropriately selected from acrylic resin, epoxy resin, polyester resin, polyurethane resin, silicone resin, amide resin, and the like. In general, the thickness of the insulating layer 101 is preferably about 2 to 20 μm.

The metal film 102 is preferably a coating formed of conductive metals such as gold, silver, copper, aluminum, and iron, or an alloy thereof, and is more preferably formed of copper in terms of cost. The metal film 102 can be appropriately selected from a rolled metal foil, an electrolytic metal foil, a sputtering film, an evaporated film, and the like. In terms of cost, a rolled metal foil is preferable, and a roller copper foil is more preferable. In the case of using a metal foil, the thickness of the metal film 102 is preferably about 0.1 to 20 μm. In the case of using a sputtering film, the thickness of the metal film 102 is preferably about 0.05 to 5.0 μm. In the case of using an evaporated film, the thickness of the metal film 102 is preferably about 10 to 500 nm. When the sputtering film is formed, ITO (indium tin oxide) or ATO (antimony trioxide) is preferably used. When the evaporated film is formed, gold, silver, copper, aluminum, or nickel is preferably used.

The conductive adhesive layer 103 preferably includes the materials described above for the conductive adhesive layer 3. The thickness of the conductive adhesive layer 103 is preferably about 2 to 70 μm, more preferably 2 to 50 μm, and most preferably about 2 to 20 μm. The printed wiring board 1 described above is merely an example and can be modified or altered without departing from the scope of the present invention.

A method of manufacturing the printed wiring board according to the present invention includes at least a step of pressure-bonding the wiring circuit board 6, the conductive adhesive layer 3, and the metal reinforcing plate 2. The pressure-bonding is performed by, for example, pressure-bonding the conductive adhesive layer 3 and the metal reinforcing plate 2 in a superimposed manner after pressure-bonding the wiring circuit board 6 and the electromagnetic shielding sheet 100, and then mounting the electronic component 10. However, the order of pressure-bonding is not limited. According to the present invention, it is only necessary to include the step of pressure-bonding the wiring circuit board 6, the conductive adhesive layer 3, and the metal reinforcing plate 2, and the other steps can be changed, as needed, depending on the configuration of the printed wiring board, or the mode in which the printed wiring board is used.

During the pressure-bonding, the metal reinforcing plate 2 and the conductive adhesive layer 3 are strongly bonded together when the ratio of the surface area of nickel hydroxide to nickel present in the surface of the nickel layer is more than 3 and equal to or less than 20. Accordingly, foaming or the like is less likely to occur when the reflow step is subsequently carried out.

When the conductive adhesive layer 3 includes a thermosetting resin, it is particularly preferable to perform heating at this time in terms of hardening acceleration of the resin during the pressure-bonding. On the other hand, since the metal reinforcing plate and the conductive adhesive layer are likely to be strongly bonded together even when the conductive adhesive layer 3 includes a thermoplastic resin, it is preferable to perform heating. Heating is preferably performed at about 150 to 180° C., and pressure-bonding is preferably performed at about 3 to 30 kg/cm². A flat-plate pressure-bonding device, a roll pressure-bonding device, and the like can be used as an application device. The flat-plate pressure-bonding device is preferably used because a constant pressure can be applied for a certain period of time. The period for pressure-bonding is not particularly limited as long as the wiring circuit board 6, the conductive adhesive layer 3, and the metal reinforcing plate 2 can be sufficiently bonded together. The period for pressure-bonding is generally about two minutes to two hours.

The printed wiring board according to the present invention uses the metal reinforcing plate in which the ratio of the surface area of nickel hydroxide to nickel in the surface of the nickel layer is more than 3 and equal to or less than 20, thereby providing the following advantageous effects. That is, an excellent conductivity is obtained; the adhesive properties between the nickel layer and the conductive adhesive layer are improved; and foaming is less likely to occur and the adhesion force is less likely to decrease after the reflow step. According to the present invention, it is possible to provide a printed wiring board which is less likely to cause air bubbles even after the reflow step, has an excellent adhesion force with respect to the reinforcing plate, and has an excellent conductivity.

EXAMPLES

The present invention will be described below in more detail with reference to examples. However, the present invention is not limited to these examples.

The members described below were used for evaluation.
<Conductive Adhesive Sheet>
TSC200-60GD (thickness: 60 μm; manufactured by TOYOCHEM CO., LTD.)
<Copper-Clad Laminate>
S'PERFLEX (copper foil with a thickness of 8 μm/polyimide with a thickness of 38 μm; manufactured by SUMITOMO METAL MINING CO., LTD.)
<Metal Reinforcing Plate>
Electrolytic plating was performed on a commercially-available stainless plate by using a nickel sulfamate bath, to thereby form a nickel layer with a thickness of 2 μm on the surface of the stainless plate. During this process, sampling was performed while adjusting the conditions for electrolytic plating by a well-known method, and metal reinforcing plates (SUS plates) (1) to (6) respectively including nickel layers which have different ratios of the surface area of nickel hydroxide to nickel, different contact angles with water, and different surface roughnesses Ra were obtained. Each of the metal reinforcing plates was prepared on a test plate A having a thickness of 0.2 mm, a width of 30 mm, and a length of 150 mm, and on a test plate B having a thickness of 0.2 mm, a width of 30 mm, and a length of 50 mm. Test plates for analysis were prepared separately.

Examples 1 to 4 and Comparative Examples 1 and 2

The following analysis and evaluation were performed on the obtained metal reinforcing plates (1) to (4) as Examples 1 to 4 and on the obtained metal reinforcing plates (5) and (6) as Comparative Examples 1 and 2.

<Surface Analysis>

To calculate the ratio of the surface area of nickel hydroxide to nickel in the nickel layer, XPS analysis was conducted on the surfaces of the obtained test plates under the following conditions. A reference peak used for measurement of nickel was 852.3 eV; a reference peak for measurement of nickel oxide was 853.3 eV; and a reference peak for measurement of nickel hydroxide was 856 eV. The half-width of each peak was automatically set. The measurement was carried out under the following conditions: AXIS-HS (manufactured by Shimadzu Corporation/Kratos Analytical Ltd.) was used; an X-ray source "Dual Mg" was selected; the measurement surface of the nickel layer was washed with ethanol; the acceleration voltage of the electron gun was 15 kV; the emission voltage was 5 mA; the measurement range was 0 to 1200 eV; the step size was 0.1 eV; the dwell time was 300 ms; the background was eliminated by a straight line method; and calculation processes were performed five times.

<Contact Angle>

The contact angle between water and the surface of the nickel layer was measured in the following manner by a sessile drop method. At a temperature of 23° C. in a 50% RH atmosphere, 2 μL of ion exchange water were dropped on the surface of each of the test plates that were washed with ethanol in advance, and θ/2 was measured after a lapse of 60 seconds from the time when a droplet of the ion exchange water reached the surface. The measurement was carried out in accordance with JIS R3257 by using the automatic contact angle meter DM-501 (manufactured by Kyowa Interface Science Co., LTD.).

<Surface Roughness Ra>

The surface roughness Ra was measured under the following conditions. That is, image data on the surface of each test plate was loaded in a laser microscope, and the tilt was automatically corrected by an analysis application. After that, the surface roughness Ra in a square of 1 mm×1 mm was measured. Note that the surface roughness Ra refers to an arithmetic average roughness which complies with JIS B0601. The measurement was carried out using the shape measurement laser microscope VK-X100 (manufactured by KEYENCE CORPORATION), VK-H1XV (manufactured by KEYENCE CORPORATION) as an observation application, and VK-H1XJ (manufactured by KEYENCE CORPORATION) as an image connecting application.

<Preparation of a Laminate for Test>

A conductive adhesive sheet having a width of 25 mm and a length of 100 mm was prepared. Next, one of the peelable sheets was peeled off, and the exposed conductive adhesive layer was placed on the test plate A and was temporarily joined to the test plate A by a roll laminator (SA-1010 Tabletop Test Laminator manufactured by TESTER SANGYO CO, LTD.) at 90° C., 3 kgf/cm$^2$, and 1 m/min. Then, the other peelable sheet was peeled off, and the polyimide surface of S'PERFLEX placed on the exposed conductive adhesive layer was bought into contact with the conductive adhesive layer, and was temporarily joined to the test plate A under the same roll laminate conditions as those described above. These sheets were pressure-bonded for five minutes under the conditions of 170° C. and 2 MPa. After that, heating was performed for 60 minutes in an electronic oven of 160° C. Thus, the laminate was obtained.

<Peel Strength>

To measure the adhesive strength between the conductive adhesive layer and each test plate, a T-peel test was carried out on the obtained laminate at a pulling rate of 50 mm/min under an atmosphere of 23° C. with a relative humidity of 50%, and the peel strength (N/cm) at a room temperature (23° C.) was measured. A small tabletop testing machine (EZ-TEST manufactured by Shimadzu Corporation) was used as a testing machine. The peel strength is also called an adhesion force.

To measure the peel strength after the reflow, the reflow step was carried out on the obtained laminate at a peak temperature of 260° C. by using a small reflow machine (manufactured by SOLSYS-62501RTP ANTOM CO., LTD.). After the laminate was left for one hour under the atmosphere of 23° C. with a relative humidity of 50%, the peel strength (N/cm) after the reflow was measured by a method similar to that described above under the same atmosphere as that described above. Note that the peel strength was evaluated based on the following standards.

A: The peel strength is equal to or greater than 8 N/cm
C: The peel strength is less than 8 N/cm <Solder Float Test>

The obtained laminate was allowed to float with the metal reinforcing plate facing downward on a molten solder of 260° C. for one minute. Then, immediately after taking the laminate out of the molten solder, the laminate was confirmed by visually observing the appearance of the conductive adhesive layer from the side surface of the laminate, and was evaluated based on the following standards. A rectangular solder bath (POT 100C manufactured by TAIYO ELECTRIC IND. CO., LTD.) was used for the evaluation. The evaluation was carried out five times for each sample.

A: No abnormality was found in the five evaluations of all the samples. (Excellent)
B: Air bubbles were generated in one or two of the five evaluations. (Practicable)
C: Air bubbles were generated in three or more of the five evaluations. (Impracticable)

<Connection Resistance>

A laminate was obtained by performing the above-described process of <preparation of a laminate for test> in a similar manner, except that the conductive adhesive sheet used in the <preparation of a laminate for test> was replaced by a conductive adhesive sheet having a width of 10 mm and a length of 50 mm and the test plate B was used instead of the test plate A. The connection resistance of the obtained laminate was measured by a four-terminal method using a resistivity meter (LORESTA GP MCP-T600 manufactured by Mitsubishi Chemical Corporation). Note that the connection resistance was evaluated based on the following standards.

A: The connection resistance is less than 20 mΩ
C: The connection resistance is equal to or more than 20 mΩ

TABLE 1

| | Ratio of surface area of nickel hydroxide to nickel | Surface roughness Ra (μm) | Contact angle (°) | Peel strength | | | Connection resistance | | Solder float test |
|---|---|---|---|---|---|---|---|---|---|
| Metal reinforcing plate | | | | Peel strength (N/cm) | Peel strength after reflow (N/cm) | Evaluation | Connection resistance (mΩ) | Evaluation | |
| Example 1 | 1 | 15.1 | 0.49 | 74.26 | 13.1 | 13.2 | A | 14.2 | A | A |
| Example 2 | 2 | 15.4 | 0.91 | 79.48 | 9.4 | 8.2 | A | 14.6 | A | A |
| Example 3 | 3 | 3.2 | 0.53 | 51.24 | 9.3 | 9.4 | A | 13.2 | A | A |
| Example 4 | 4 | 19.1 | 0.53 | 98.74 | 14.9 | 14.1 | A | 19.4 | A | A |
| Comparative Example 1 | 5 | 24.6 | 0.54 | 135.21 | 16.4 | 16.3 | A | 24.6 | C | A |
| Comparative Example 2 | 6 | 2.4 | 0.48 | 21.20 | 5.1 | 4.1 | C | 12.4 | A | C |

Table 1 shows that when the ratio of the surface area of nickel hydroxide to nickel present in the surface of the nickel layer is more than 3 and equal to or less than 20, the joining between the metal reinforcing plate and the conductive adhesive layer becomes strong. It has been confirmed that the peel strength after the reflow test is high when the above-mentioned condition is satisfied. It has also been confirmed that the peel strength does not greatly fluctuate before and after the reflow. While Comparative Example 2 is an example in which the ratio of the surface area of nickel hydroxide to nickel is 2.4, Table 1 shows that in Comparative Example 2, the peel strength is smaller than that of the other samples and a reduction in the peel strength after the reflow is greater than that of the other samples. On the other hand, Comparative Example 1 is an example in which the ratio of the surface area of nickel hydroxide to nickel is 24.6. Table 1 shows the result that in Comparative Example 1, the contact angle is larger than that of the other samples and the connection resistance is higher than that of the other samples. Further, as a result of the solder float test, the examples other than Comparative Example 2 showed excellent results. It has been found that when the ratio of the surface area of nickel hydroxide to nickel is large, the heat resistance is enhanced.

This application is based upon and claims the benefit of priority from Japanese patent application No. 2014-179829, filed on Sep. 4, 2014, the disclosure of which is incorporated herein in its entirety by reference.

INDUSTRIAL APPLICABILITY

A printed wiring board according to the present invention can be suitably mounted not only on electronic devices, such as a mobile phone, a smartphone, a laptop computer, a digital camera, and a liquid crystal display, but also on transportation devices, such as, an automobile, an electric car, a ship, and an aircraft.

REFERENCE SIGNS LIST

1 PRINTED WIRING BOARD
2 METAL REINFORCING PLATE
2a METAL PLATE
2b NICKEL LAYER
3 CONDUCTIVE ADHESIVE LAYER
4a, 4b INSULATING LAYER
5a, 5b ADHESIVE LAYER
6 WIRING CIRCUIT BOARD
7 GROUND WIRING CIRCUIT
8 WIRING CIRCUIT
9 INSULATING BASE
10 ELECTRONIC COMPONENT
11 LAND
100 ELECTROMAGNETIC SHIELDING SHEET
101 INSULATING LAYER
102 METAL FILM
103 CONDUCTIVE ADHESIVE LAYER

The invention claimed is:

1. A printed wiring board comprising:
a wiring circuit board;
a conductive adhesive layer; and
a metal reinforcing plate, wherein
the conductive adhesive layer is bonded to each of the wiring circuit board and the metal reinforcing plate,
the metal reinforcing plate includes a nickel layer formed on a surface of a metal plate, and
a ratio of a surface area of nickel hydroxide to nickel present in a surface of the nickel layer is more than 3 and equal to or less than 20.

2. The printed wiring board according to claim 1, wherein a contact angle between water and the surface of the nickel layer is 50 to 100°.

3. The printed wiring board according to claim 1, wherein the nickel layer has a surface roughness Ra of 1 μm or less.

4. An electronic device comprising a printed wiring board according to claim 1.

5. A method of manufacturing a printed wiring board, comprising a step of pressure-bonding a wiring circuit board, a conductive adhesive layer, and a metal reinforcing plate so that the conductive adhesive layer is bonded to each of the wiring circuit board and the metal reinforcing plate, wherein
the metal reinforcing plate includes a nickel layer formed on a surface of a metal plate, and
a ratio of a surface area of nickel hydroxide to nickel present in a surface of the nickel layer is more than 3 and equal to or less than 20.

6. An electronic device comprising a printed wiring board manufactured by the method according to claim 5.

* * * * *